United States Patent [19]
Matsushita

[11] Patent Number: 6,157,240
[45] Date of Patent: Dec. 5, 2000

[54] OUTPUT LOGIC SETTING CIRCUIT IN SEMICONDUCTOR INTEGRATED CIRCUIT

[75] Inventor: Hiroshi Matsushita, Tokyo, Japan

[73] Assignee: NEC Corporation, Tokyo, Japan

[21] Appl. No.: 09/076,916

[22] Filed: May 13, 1998

[30] Foreign Application Priority Data

May 29, 1997 [JP] Japan .................................. 9-140387

[51] Int. Cl.[7] .............................................. H01H 85/00
[52] U.S. Cl. ........................................ 327/525; 327/198
[58] Field of Search .................................... 327/525, 526, 327/198, 199, 200; 326/16; 365/225.7, 96

[56] References Cited

U.S. PATENT DOCUMENTS

| | | | |
|---|---|---|---|
| 4,532,607 | 7/1985 | Uchida ....................................... | 365/96 |
| 4,533,841 | 8/1985 | Konishi ..................................... | 326/38 |
| 4,707,806 | 11/1987 | Takemae et al. .......................... | 365/96 |
| 5,731,733 | 3/1998 | Denham .................................... | 327/525 |
| 5,801,574 | 9/1998 | Martin et al. ............................. | 327/525 |

FOREIGN PATENT DOCUMENTS

| | | |
|---|---|---|
| 58-175194 | 10/1983 | Japan . |
| 60-254500 | 12/1985 | Japan . |
| 63-204627 | 8/1988 | Japan . |
| 63-268186 | 11/1988 | Japan . |
| 63-291298 | 11/1988 | Japan . |
| 1-062898 | 3/1989 | Japan . |
| 4-061697 | 2/1992 | Japan . |
| 4-358400 | 12/1992 | Japan . |

*Primary Examiner*—Timothy P. Callahan
*Assistant Examiner*—An T. Luu
*Attorney, Agent, or Firm*—Young & Thompson

[57] ABSTRACT

An output logic setting circuit includes a fusible fuse element which is selectively rendered disconnected by external signal operation. The output logic setting circuit is designed to output, from an output terminal, a change in logic output state when the fuse element is rendered disconnected. The output logic setting circuit includes an inverter circuit which is arranged between the fuse element and the output terminal and which has a threshold set to ensure proper circuit operation even if the blown fuse element returns to an apparent connected state over time.

8 Claims, 1 Drawing Sheet

OUTPUT LOGIC SETTING CIRCUIT IN SEMICONDUCTOR INTEGRATED CIRCUIT

BACKGROUND OF THE INVENTION

1. Field of the Invention

The present invention relates to a semiconductor integrated circuit and, more particularly, to an output logic setting circuit which is arranged in a semiconductor integrated circuit to perform output logic setting.

2. Description of the Prior Art

An output logic setting circuit of this type includes a fuse to perform output logic setting. For example, such an output logic setting circuit is used in a constant-current generating circuit which has a fuse connected to the input terminal of a decoder for outputting trimming data so as to obtain necessary trimming data from the decoder by externally and selectively fusing the fuse.

FIG. 1 shows an output logic setting circuit arranged in a conventional semiconductor integrated circuit.

As shown in FIG. 1, this conventional circuit is constituted by a power-down reset circuit 100, an inverter circuit 101 having one terminal connected to the output stage of the power-down reset circuit 100 and the other terminal connected to an output terminal 10, and a selectively fusible fuse element 8 which is connected between the power-down reset circuit 100 and a ground potential $V_{CC}$ and is selectively rendered conductive or disconnected by external signal operation.

The power-down reset circuit 100 includes transistors 1 and 3 having gate terminals connected to a reset terminal 11, and a pull-up transistor 2 having a gate terminal connected to the ground potential $V_{CC}$. The inverter circuit 101 includes transistors 4 and 5 having gate terminals connected to the output stage of the power-down reset circuit 100.

When the initial value in the output logic setting circuit having the above arrangement is to be changed, a fusing voltage is applied between a fusing pad 12 and the ground potential $V_{CC}$ to sever the fuse 8. The active-low power-down reset circuit 100 is then operated. With this operation, the input potential of the inverter circuit 101 on the subsequent stage is changed by the pull-up transistor 2 whose gate level is set to the ground voltage, thereby performing output logic setting.

In general, in an output logic setting circuit manufactured on a semiconductor substrate, a fuse element is made of a polysilicon layer formed on a field oxide film, and output logic setting is performed by selectively rendering the fuse element conductive or disconnecting it in accordance with external signal operation.

When, however, the output logic setting circuit shown in FIG. 1 is manufactured on a semiconductor integrated circuit for the above purpose, the resistance of the fuse element changes due to a change in quality over a long period of time since the manufacture of the circuit. In this case, the circuit may be returned to a connected state even if the fuse element is set to be in a disconnected state. As a result, the input voltage to the inverter circuit becomes unstable, and the output logic value may be inverted with respect to an expected value.

SUMMARY OF THE INVENTION

The present invention has been made in consideration of the above situation in the prior art, and has as its object to provide an output logic setting circuit in a semiconductor integrated circuit, which can prevent a change in output logic due to a change in fuse element quality over time.

In order to achieve the above object, according to the principal aspect of the present invention, an output logic setting circuit is provided which includes a fuse element which is selectively rendered connected or disconnected by external signal operation. The output logic setting circuit is adapted to provide an output logic state change from an output terminal when the fuse element is rendered disconnected. The output logic setting circuit comprises a first inverter circuit arranged between the fuse element and the output terminal which has a threshold larger than a predetermined value.

The threshold in the first inverter circuit according to the principal aspect of the present invention is set such that a resistance of the fuse element is 1 kΩ or greater even if the fuse element is in a connected state.

According to the output logic setting circuit of the present invention having the above arrangement, since the first inverter circuit whose threshold is larger than a predetermined value discussed above is arranged between the fuse element and the output terminal, the gate level of the pull-up transistor in the power-down reset circuit is controlled by the first inverter circuit. Therefore, even if the fuse element is returned to a a connected state over time due to aging, its resistance remains at least 1 kΩ, and for this reason, the output logic state is not inverted. In this manner, the output logic setting circuit is stabilized.

The above and many other objects, features and advantages of the present invention will become manifest to those skilled in the art upon making reference to the following detailed description and accompanying drawing in which a preferred embodiment incorporating the principles of the present invention are shown by way of an illustrative example.

DETAILED DESCRIPTION OF THE PREFERRED EMBODIMENT

A preferred embodiment of the present invention will be described in detail below with reference to the accompanying drawing.

Figure 1:
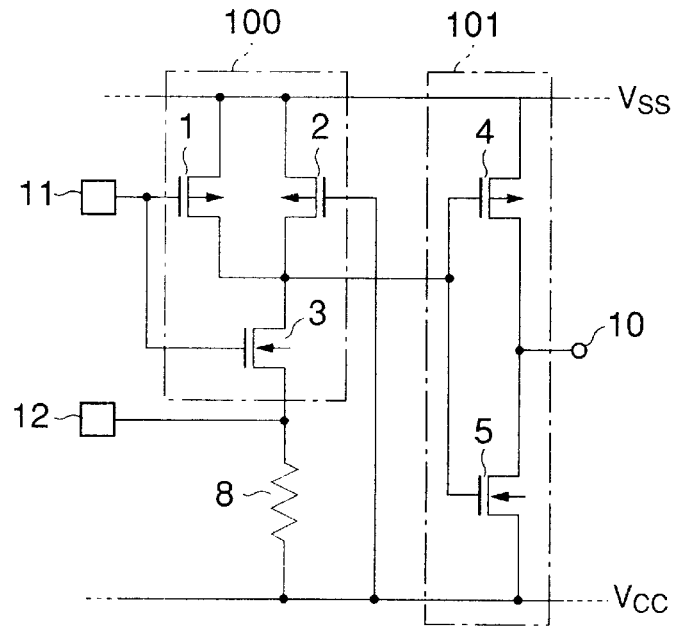
FIG. 1 is a circuit diagram showing a conventional output logic setting circuit arranged in a semiconductor integrated circuit.
Figure 2:
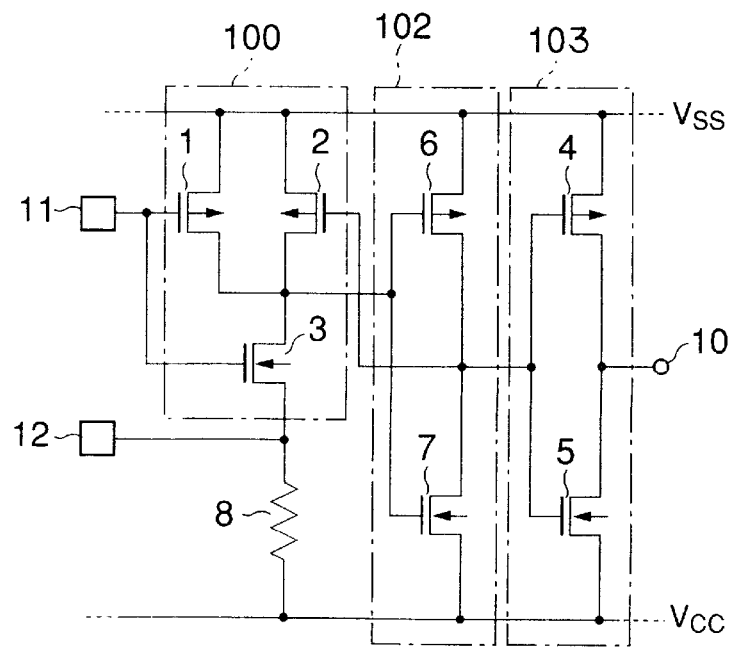
FIG. 2 is a circuit diagram showing an output logic setting circuit according to an embodiment of the present invention which is arranged in a semiconductor integrated circuit.

FIG. 2 is a circuit diagram showing an output logic setting circuit according to an embodiment of the present invention which is arranged in a semiconductor integrated circuit.

As shown in FIG. 2, this embodiment includes a power-down reset circuit 100, a first inverter circuit 102 having a threshold larger than a predetermined value and connected to the output stage of the power-down reset circuit 100, a second inverter circuit 103 connected to the power-down reset circuit 100 and the output stage of the first inverter circuit 102, and a selectively fusible fuse element 8 which is connected between the power-down reset circuit 100 and a ground potential $V_{CC}$ and is selectively rendered conductive or disconnected by external signal operation. The power-down reset circuit 100 is constituted by transistors 1 and 3 arranged on the input side of the circuit and having gate terminals connected to a reset terminal 11, and a pull-up transistor 2 arranged on the output side of the circuit and having a gate terminal connected to the output stage of the first inverter circuit 102 and the input stage of the second inverter circuit 103. The first inverter circuit 102 is constituted by transistors 6 and 7 having gate terminals connected to the output stage of the power-down reset circuit 100. The second inverter circuit 103 is constituted by transistors 4 and 5 having gate terminals connected to the gate terminal of the transistor 2 in the power-down reset circuit 100 and the output stage of the first inverter circuit 102. A threshold is set in the first inverter circuit 102, for proper inverter operation even if the resistance of the fuse element 8 becomes as low as 1 kΩ. The fuse element 8 is made of a polysilicon layer formed on a field oxide film.

When the initial logic state output value in the circuit having the above arrangement is to be changed, a fusing voltage is applied between a fusing pad 12 and the ground potential $V_{CC}$ to disconnect the fuse element 8.

Subsequently, the low-active power-down reset circuit 100 is operated. With this operation, the input voltage to the first inverter circuit 102 on the subsequent stage is changed by the pull-up transistor 2 whose gate level is set to the level of an output from the first inverter circuit 102. At the same time, the second inverter circuit 103 in the next stage is controlled to perform output logic state setting.

As is obvious from the above description, according to the output logic setting circuit of the present invention, since the first inverter circuit 102, whose threshold is larger than a predetermined value, is arranged between the fuse element and the output terminal, the gate level of the pull-up transistor in the power-down reset circuit is controlled by the first inverter circuit 102. Even if a disconnected fuse element returns to a connected state, its resistance is at least 1 kΩ, and for this reason, the output logic state is not inverted. In this manner, the output logic setting circuit is stabilized.

What is claimed is:

1. An output logic setting-circuit comprising:

an output terminal;

a resistive fuse element, said fuse element initially being in a connected state, and being designed and adapted to be selectively placed in a disconnected state by an external signal operation, said fuse element having a predetermined resistance in both a connected state and in an aged disconnected state; and an inverter circuit connected between said fuse element and said output, a threshold of said inverter circuit being set to maintain an output logic state of said inverter circuit at a set value with said fuse element being in the aged disconnected state.

2. The output logic setting circuit of claim 1, wherein said fuse element comprises a polysilicon layer formed on a field oxide film.

3. The output logic setting circuit of claim 1, wherein said minimum predetermined resistance of said fuse element is at least 1 kΩ.

4. An output logic setting circuit comprising:

a power-down reset circuit with an input side and an output side, said input side comprising at least one transistor, a gate terminal of said at least one transistor being connected to a reset terminal, and said output side having an output transistor and an output node;

a resistive fuse element connected to a terminal other than said gate terminal of said at least one transistor, said fuse element initially being in a connected state, and being designed and adapted to be selectively placed in a disconnected state by an external signal operation, said connected state of said fuse element having a resistance of at least 1 kΩ;

a first inverter circuit having an input, an output, and an input threshold, said input being connected to said output node, said output being connected to a gate terminal of said output transistor, and said input threshold being set to maintain proper inverter operation when the resistance of said fuse element is at least 1 kΩ; and a second inverter circuit having an input and an output, said second inverter input being connected to said first inverter output, and said second inverter output being provided at an output terminal as the logic setting circuit output.

5. The output logic setting circuit of claim 4, wherein said output node is connected to a terminal of said output side transistor and to a terminal of said at least one input side transistor.

6. The output logic setting circuit of claim 4, wherein said fuse element is designed and adapted to maintain a resistance of 1 kΩ or greater to stabilize a value set by said second inverter output as the circuit ages.

7. The output logic setting circuit of claim 6, wherein said fuse element comprises a polysilicon layer formed on a field oxide film.

8. The output logic setting circuit of claim 4, wherein said at least one transistor comprises a first input transistor and a second input transistor connected in series, said first and said second input transistors each having a gate terminal connected to said reset terminal, said output transistor and said first input transistor being connected in parallel, said output node being connected between said first and said second input transistors and to a terminal of said output transistor, and said fuse element being connected to a terminal of said second input transistor and to a potential.

* * * * *